United States Patent
Ciubotaru et al.

(10) Patent No.: US 10,848,101 B2
(45) Date of Patent: Nov. 24, 2020

(54) OUTPUT BUFFER FOR SINGLE-PIN CRYSTAL OSCILLATORS

(71) Applicant: Arm Limited, Cambridge (GB)

(72) Inventors: Alexandru Aurelian Ciubotaru, Coconut Creek, FL (US); Dan Laurentiu Zupcau, Boca Raton, FL (US); Thomas Ryan Harrington, Plantation, FL (US)

(73) Assignee: Arm Limited, Cambridge (GB)

( * ) Notice: Subject to any disclaimer, the term of this patent is extended or adjusted under 35 U.S.C. 154(b) by 77 days.

(21) Appl. No.: 16/205,517

(22) Filed: Nov. 30, 2018

(65) Prior Publication Data

US 2020/0177128 A1   Jun. 4, 2020

(51) Int. Cl.
*H03B 5/36* (2006.01)
*H03B 5/06* (2006.01)
*H03K 3/00* (2006.01)

(52) U.S. Cl.
CPC ............... *H03B 5/364* (2013.01); *H03B 5/06* (2013.01); *H03K 3/00* (2013.01); *H03B 2200/0026* (2013.01); *H03B 2200/0058* (2013.01); *H03B 2200/0062* (2013.01)

(58) Field of Classification Search
CPC .. H03B 5/364; H03B 5/06; H03B 2200/0062; H03B 2200/0058; H03B 2200/0026; H03K 3/00
USPC ......... 331/158, 116 R, 116 FE, 74; 327/108, 327/170
See application file for complete search history.

(56) References Cited

U.S. PATENT DOCUMENTS

| 4,044,317 | A | * | 8/1977 | Newell | ................ | H03K 3/0307 |
| | | | | | | 331/116 R |
| 7,109,813 | B2 | | 9/2006 | Pan | | |
| 7,183,868 | B1 | * | 2/2007 | Wessendorf | ......... | H03K 3/3545 |
| | | | | | | 331/116 FE |
| 2006/0267704 | A1 | | 11/2006 | Stevenson et al. | | |
| 2011/0037527 | A1 | * | 2/2011 | Shrivastava | ............. | H03B 5/06 |
| | | | | | | 331/158 |

(Continued)

OTHER PUBLICATIONS van den Romberg, J.A.T.M., "A Universal 0.03-mm# One-Pin Crystal Oscillator in CMOS", IEEE J. Solid-State Circuits, pp. 956-961, Jul. 1999, vol. 34, No. 7.

(Continued)

*Primary Examiner* — Arnold M Kinkead
(74) *Attorney, Agent, or Firm* — Leveque IP Law, P.C.

(57) ABSTRACT

An output buffer for an oscillator circuit and associated methodology. The output buffer has inverters and at least one negative feedback loop coupled to corresponding inverters. The negative feedback loop of the circuit is disabled in response to a control signal until one or more of a defined level of oscillation and a defined period of time is reached during start-up of the oscillator circuit, and is thereafter enabled. At least one of the inverters has at least one second negative feedback loop coupled to the corresponding inverter. An amount of feedback provided by the second negative feedback loop is adjustable in response to a control signal, where a first feedback level is present until a defined level of oscillation and/or a defined period of time is reached during start-up, a second feedback level is thereafter present in, and the first feedback level is less than the second feedback level.

19 Claims, 15 Drawing Sheets

(56) References Cited

U.S. PATENT DOCUMENTS

2012/0126907 A1* 5/2012 Nakamoto .............. H03B 5/36
331/155

OTHER PUBLICATIONS

Maekawa, T. et al., "Design of CMOS inverter-based output buffers adapting the Cherry- Hopper broadbanding techniques", 2009 European Conference on Circuit Theory and Design, pp. 511-514.
Fairchild Semiconductor, AN-88, "CMOS Linear Applications," https://www.fairchildsemi.com/application-notes/AN/AN-88.pdf, Fairchild Semiconductor. Application Note. Jul. 1973. Revised Apr. 2003.
Zheng, W. et al., "Analysis and design of quickly starting crystal oscillator", 2015 IEEE 11th Int. Conf. on ASIC (ASICON), Nov. 3-6, 2015.
Vittoz, E., 'Low-Power Crystal and MEMS Oscillators', Springer, 2010, Ch. 6.
Martins, M.A. et al., "A 0.02-to-6GHz Sdr Balun-LNA Using a Triple-Stage Inverter- Based Amplifier", 2012 IEEE International Symposium on Circuits and Systems, pp. 472-475.

\* cited by examiner

OUTPUT BUFFER FOR SINGLE-PIN CRYSTAL OSCILLATORS

BACKGROUND

The present disclosure relates generally to integrated circuits, and more particularly, to an output buffer for single-pin crystal oscillators with fast start-up capability.

Modern clocking circuits in integrated circuits require stable frequency references (e.g., oscillators) with fast turn-on, small output noise, and low power consumption. Because of stringent frequency stability requirements, an external resonator with a high-quality factor (e.g., a quartz crystal) is typically employed in conjunction with active components in the integrated circuit for generating the reference oscillations. However, because the number of pins available in an integrated circuit for interfacing with other external circuits is limited, it is advantageous to use only one pin for connecting the resonator. Consequently, circuit implementations of oscillators that satisfy the foregoing requirements are challenging, especially in low-supply-voltage environments where the active devices (e.g., transistors) must operate with small headroom voltages.

In order to ensure an optimum duty cycle of the output signal and achieve low output phase noise, an output buffer having a plurality of inverters with global feedback is AC-coupled to the crystal node of the oscillator. However, due to the presence of an AC-coupling capacitor at the input of the buffer, the global feedback around inverters in the circuit produces a self-oscillation signal that may interfere with the normal start-up transient of the oscillator and may even cause the incorrect start-up on a harmonic frequency of the crystal.

Accordingly, there exists a need for an output buffer for crystal oscillators that prevents self-oscillation in the output buffer during and after start-up, allows for fast oscillator start-up by preventing interference caused by such self-oscillation, ensures low output phase noise, and provides a duty cycle of the digital output signal appropriate for driving other digital circuits in the system.

BRIEF DESCRIPTION OF THE DRAWINGS

The present disclosure is illustrated by way of example and not limited in the accompanying figures in which like reference numerals indicate similar elements and in which.

DETAILED DESCRIPTION

Figure 1:
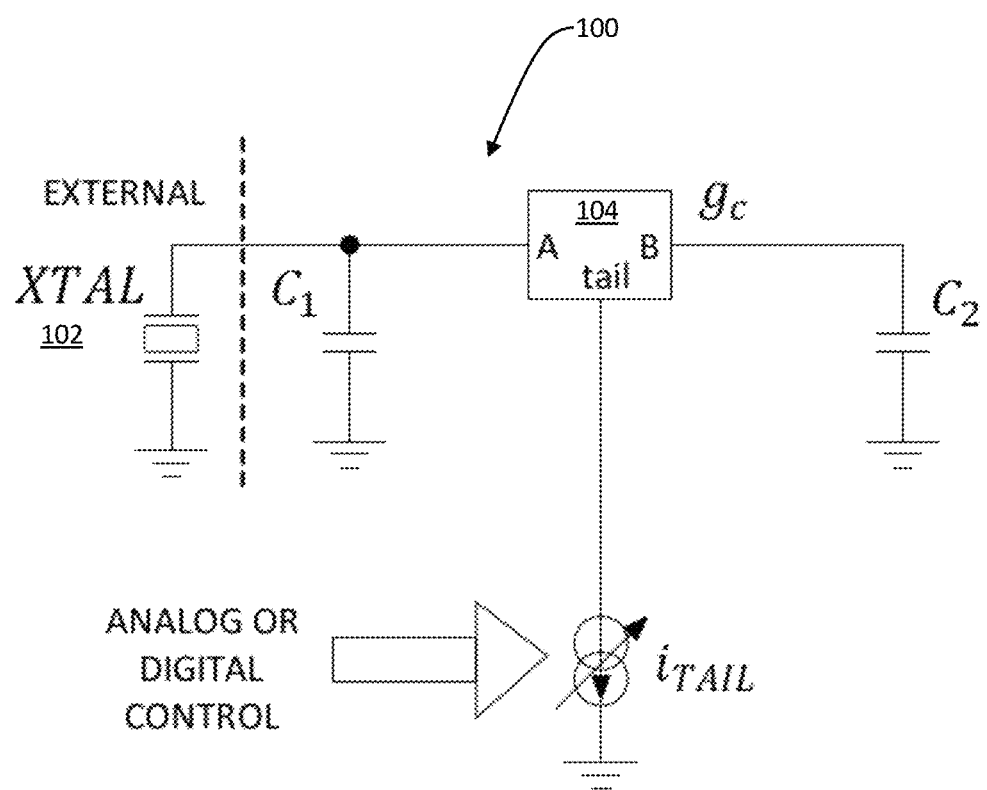
FIG. 1 is a schematic of an exemplary circuit for controlling the loop gain to accelerate the start-up of a one-pin crystal oscillator.

Specific embodiments of the disclosure will now be described in detail regarding the accompanying figures. For simplicity and clarity of illustration, where considered appropriate, reference numerals may be repeated among the figures to indicate corresponding or analogous elements. In addition, numerous specific details are set forth in order to provide a thorough understanding of the examples described herein. However, it will be understood by those of ordinary skill in the art that the examples described herein may be practiced without these specific details. In other instances, well-known methods, procedures and components have not been described in detail so as not to obscure the examples described herein. Also, the description is not to be considered as limiting the scope of the examples described herein.

It will be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

In the following detailed description of embodiments of the disclosure, numerous specific details are set forth in order to provide a more thorough understanding of the disclosure. However, it will be apparent to those skilled in the art that the disclosure may be practiced without these specific details. In other instances, well-known features have not been described in detail to avoid unnecessarily complicating the description.

It is to be understood that the terminology used herein is for the purposes of describing various embodiments in accordance with the present disclosure and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period.

As used herein, the terms "about" or "approximately" apply to all numeric values, irrespective of whether these are explicitly indicated. Such terms generally refer to a range of numbers that one of skill in the art would consider equivalent to the recited values (i.e., having the same function or result). These terms may include numbers that are rounded to the nearest significant figure. In this document, any references to the term "longitudinal" should be understood to mean in a direction corresponding to an elongated direction of a personal computing device from one terminating end to an opposing terminating end.

In accordance with one embodiment of the present disclosure, there is provided an output buffer for an oscillator circuit. The output buffer includes at least one inverter and at least one feedback loop coupled to a corresponding inverter. An amount of feedback provided by the feedback loop is adjustable in response to a control signal, where a first feedback level of the circuit is present in the circuit until one or more of a defined level of oscillation and a defined period of time is reached during start-up of the oscillator circuit, a second feedback level is thereafter present in the oscillator circuit, and the first feedback level is less than the second feedback level.

In accordance with another embodiment, the defined period of time is a time window defined by a first time when the first feedback level is present in the oscillator circuit, and a second time later than the first time when the second feedback level is present in the circuit.

In accordance with yet another embodiment, the oscillator circuit is a single-pin crystal oscillator, a van den Homberg oscillator, or the like.

In accordance with another embodiment, an output buffer for an oscillator circuit includes a plurality of inverters and at least one negative feedback loop coupled to a subset of the plurality of corresponding inverters. The at least one negative feedback loop of the circuit is disabled in the oscillator circuit in response to a control signal until one or more of a defined level of oscillation and a defined period of time is reached during start-up of the oscillator circuit. The at least one negative feedback loop is thereafter enabled in the circuit.

In accordance with another embodiment, a subset of the plurality of inverters is an odd number of inverters.

In accordance with still another embodiment, a subset of the plurality of inverters have selectively enabled and disabled negative feedback loops.

In accordance with yet another embodiment, at least one switch responsive to the control signal is provided in the oscillator circuit for adjusting the feedback loop.

In accordance with still another embodiment, at least one switch responsive to the control signal is provided in the oscillator circuit for disabling and enabling the at least one negative feedback loop.

In accordance with another embodiment, there is provided an output buffer for an oscillator circuit. The output buffer includes a plurality of inverters and at least one negative feedback loop coupled to a subset of the plurality of corresponding inverters. The at least one negative feedback loop of the circuit is disabled in the oscillator circuit in response to a control signal until one or more of a defined level of oscillation and a defined period of time is reached during start-up of the oscillator circuit. The at least one negative feedback loop is thereafter enabled in the circuit. At least one inverter of the plurality of inverters has at least one second negative feedback loop coupled to the corresponding at least one inverter. An amount of feedback provided by the second negative feedback loop is adjustable in response to a control signal, where a first feedback level of the circuit is present in the oscillator circuit until one or more of a defined level of oscillation and a defined period of time is reached during start-up of the oscillator circuit, a second feedback level is thereafter present in the circuit, and the first feedback level is less than the second feedback level.

In accordance with another embodiment, there is provided a method of buffering an oscillator circuit coupled to an oscillator. The method includes adjusting, in response to a control signal, an amount of feedback provided by at least one feedback loop coupled to a corresponding inverter, where a first feedback level of the circuit is present in the circuit until one or more of a defined level of oscillation and a defined period of time is reached during start-up of the oscillator circuit, a second feedback level is thereafter present in the oscillator circuit, and the first feedback level is less than the second feedback level.

In accordance with still another embodiment, there is provided a method of buffering an oscillator circuit coupled to an oscillator, where the method includes disabling, in response to a control signal, at least one negative feedback loop coupled to a subset of a plurality of inverters in the oscillator circuit until one or more of a defined level of oscillation and a defined period of time is reached during start-up of the oscillator circuit, where the at least one negative feedback loop is thereafter enabled in the circuit.

In accordance with yet another embodiment for controlling local and global feedback, the method includes disabling, in response to a control signal, at least one negative feedback loop coupled to a subset of a plurality of inverters in the oscillator circuit until one or more of a defined level of oscillation and a defined period of time is reached during start-up of the oscillator circuit, and where the at least one negative feedback loop is thereafter enabled in the circuit. The method further includes adjusting, in response to a control signal, an amount of feedback provided by at least a second negative feedback loop coupled to a corresponding inverter of at least one inverter, where a first feedback level of the circuit is present in the circuit until one or more of a defined level of oscillation and a defined period of time is reached during start-up of the oscillator circuit, a second feedback level is thereafter present in the oscillator circuit, and the first feedback level is less than the second feedback level.

Figure 2:
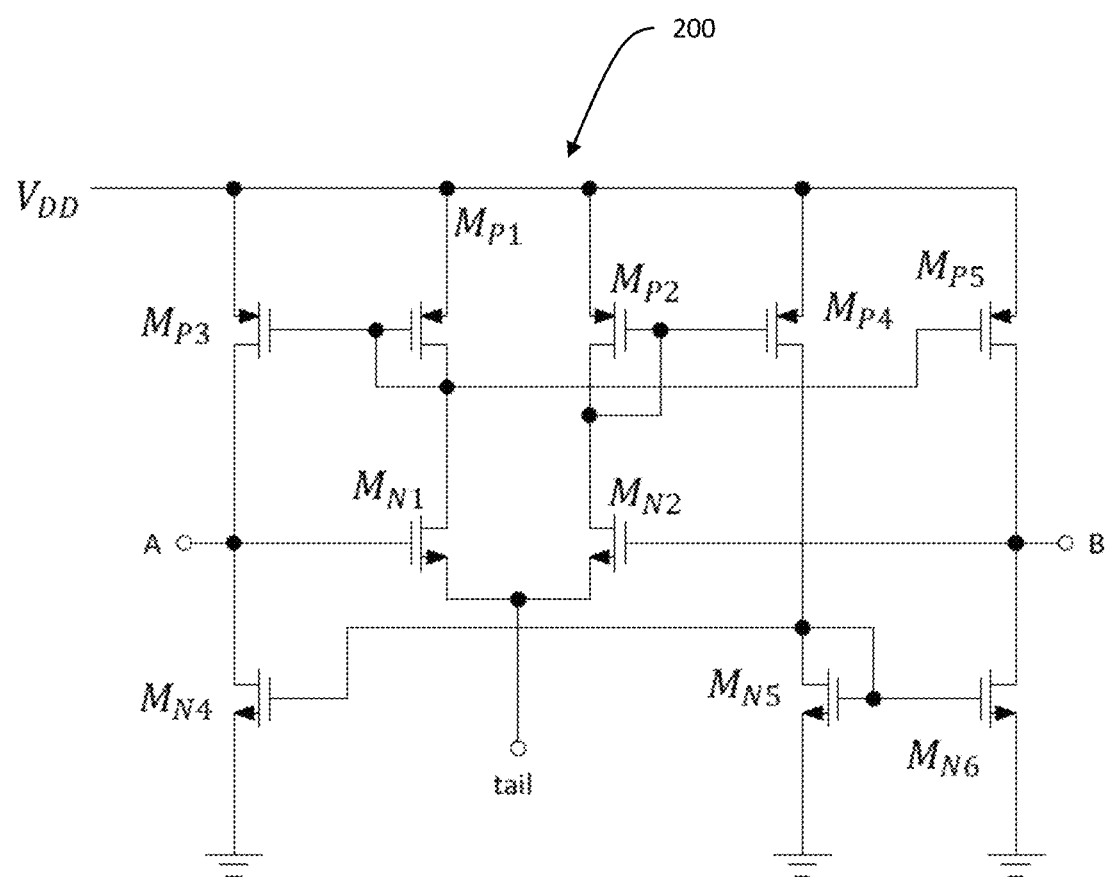
FIG. 2 is a schematic of an illustrative circuit for the transconductance cell shown in FIG. 1.
Figure 3:
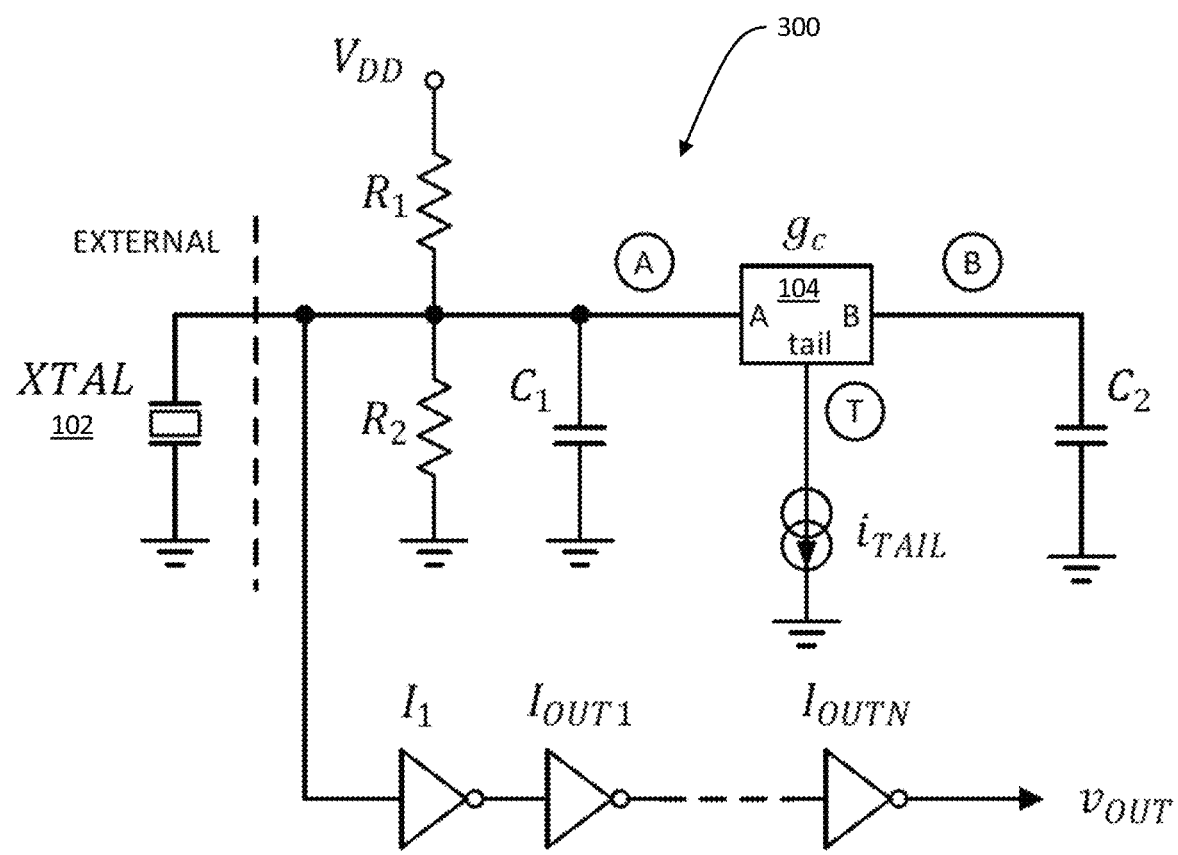
FIG. 3 depicts a modification of the circuit of FIG. 1, where a cascade of inverters are included in the circuit.

Referring to FIG. 1, there is depicted an exemplary circuit for controlling the loop gain to accelerate the start-up of a one-pin oscillator 100 having a resonator 102, where $g_c$ is a transconductance cell 104 with output nodes "A" and "B". The oscillator may be, for example, a van den Homberg oscillator. An illustrative circuit 200 for the transconductance cell $g_c$ 104 of FIG. 1 is shown in the schematic diagram of FIG. 2. Circuit 200 comprises a plurality of transistors $M_{P1}, \ldots, M_{P5},$ and $M_{N1}, \ldots, M_{N6}$ arranged as shown. The loop gain is controlled by adjusting the tail current $i_{TAIL}$ applied to $M_{N1}, M_{N2}$ using either analog or digital techniques known to one of ordinary skill in the art. In FIG. 3, there is illustrated a circuit 300 similar to that of circuit 100 shown in FIG. 1 (where like components have the same reference numerals), having a cascade of inverters $I_1$, $I_{OUT1}$ . . . $I_{OUTN}$. As used herein, the term "inverter" may include any number of inverters. In such an arrangement, where the supply voltage $V_{DD}$ is small (e.g., 0.9V), the common-mode (bias) voltage of the transconductor (DC voltages of nodes A and B) must be significantly different from $V_{DD}/2$ (e.g., $V_A=V_B=0.6V>0.45$ $V=V_{DD}/2$) such that all transistors in the circuit 300 operate outside of a triode region. Accordingly, in situations where the signal on node A has a small amplitude, the duty cycle of the digitally compatible output signal $V_{OUT}$ may differ significantly from 50%, which can consequently create problems in the digital circuitry for which the oscillator circuit provides a reference clock signal.

Figure 4:
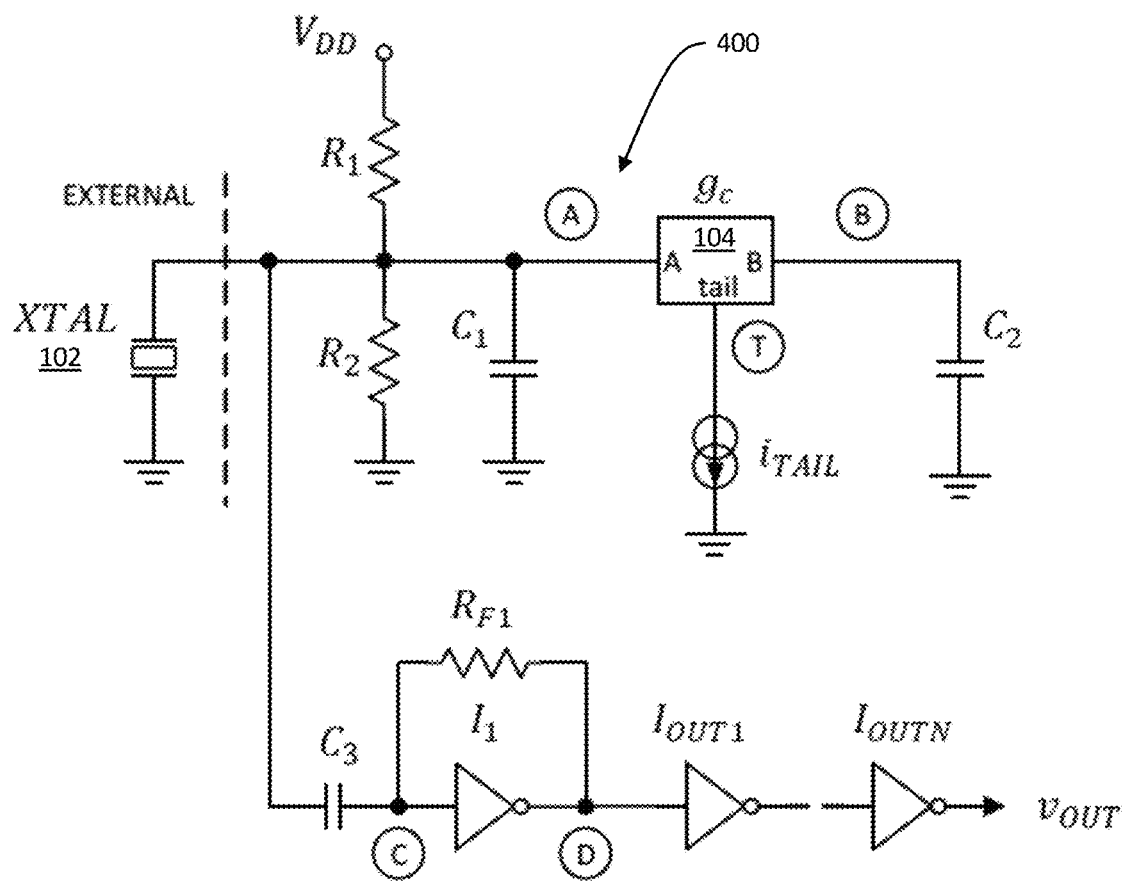
FIG. 4 is a schematic of a circuit similar to that shown in FIG. 3, where duty-cycle variations are alleviated by incorporating an AC-coupled self-biased inverter that operates as a low-gain amplifier.
Figure 5:
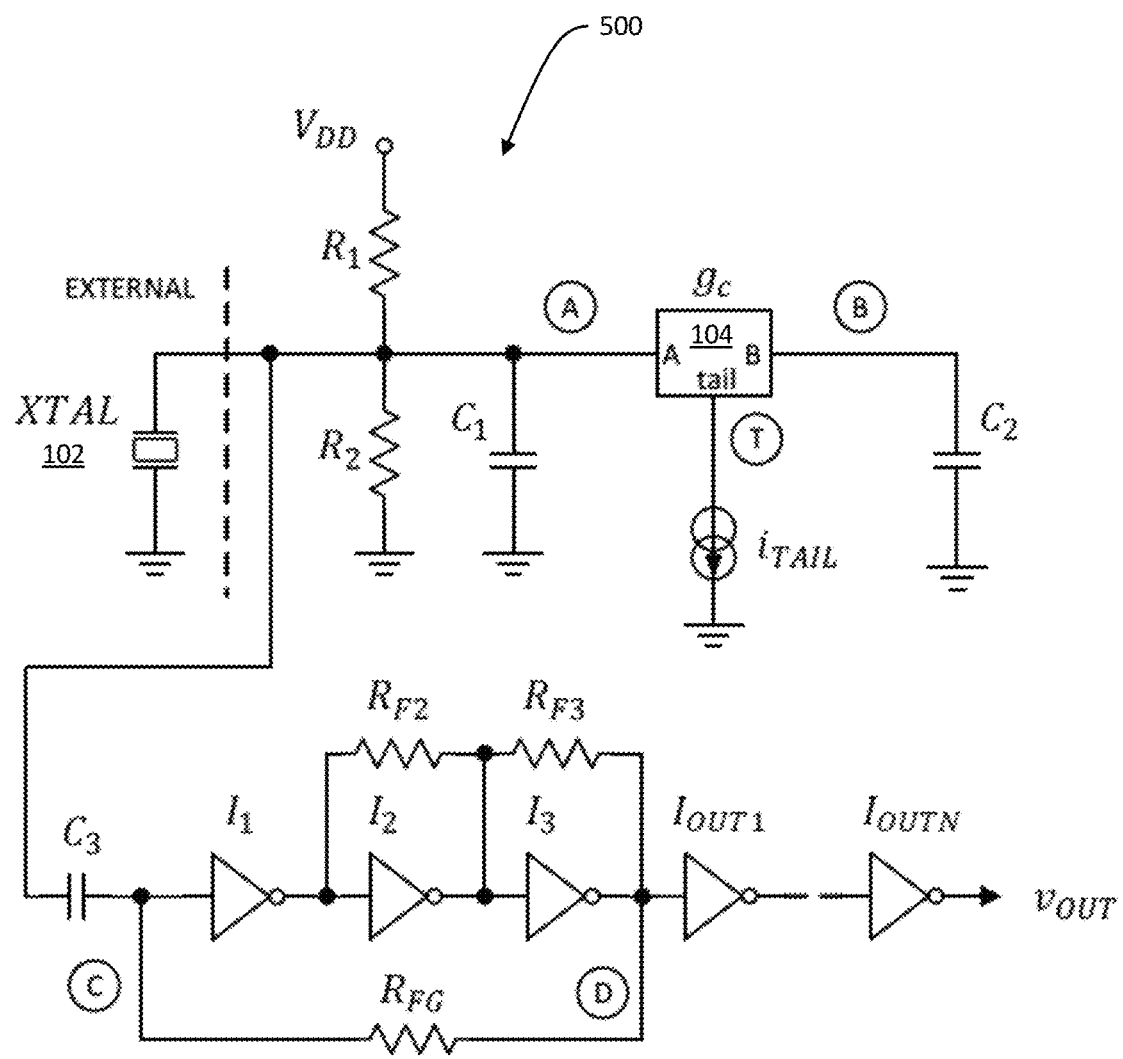
FIG. 5 is a schematic of a circuit which includes a plurality of inverters arranged in series between nodes with feedback resistors that provide local feedback around a subset of inverters and a resistor that provides global feedback in the circuit.

With reference to FIG. 4, there is depicted a circuit 400 similar to that shown in FIG. 3 (with like components having similar reference numerals), where the duty-cycle variation is alleviated by incorporating an AC-coupled self-biased inverter $I_1$ that operates as a low-gain amplifier. A feedback resistor $R_{F1}$ provides a feedback loop around inverter $I_1$. This configuration, however, still does not ensure low phase noise at the oscillator output due to slow signal transitions on nodes C and D due to the relatively low gain of the amplifier. Accordingly, the gain of the AC-coupled amplifier can be increased using a circuit configuration 500 as shown in FIG. 5, which includes a plurality of inverters ($I_1$, $I_2$, and $I_3$) arranged in series between nodes C and D, with feedback resistors $R_{F2}$ and $R_{F3}$ that provide local feedback around inverters $I_2$ and $I_3$, and resistor $R_{FG}$ that provides global feedback in the circuit 500. However, this arrangement typically causes a self-oscillation signal to appear in the buffer due to $R_{FG}$, $C_3$, and a high-frequency phase shift in the amplifying chain composed of $I_1$, $I_2$, and $I_3$. This can interfere with the normal start-up process of the oscillator and/or may cause the oscillator to start incorrectly, as well as to properly maintain, a harmonic frequency of the crystal.

Figure 6:
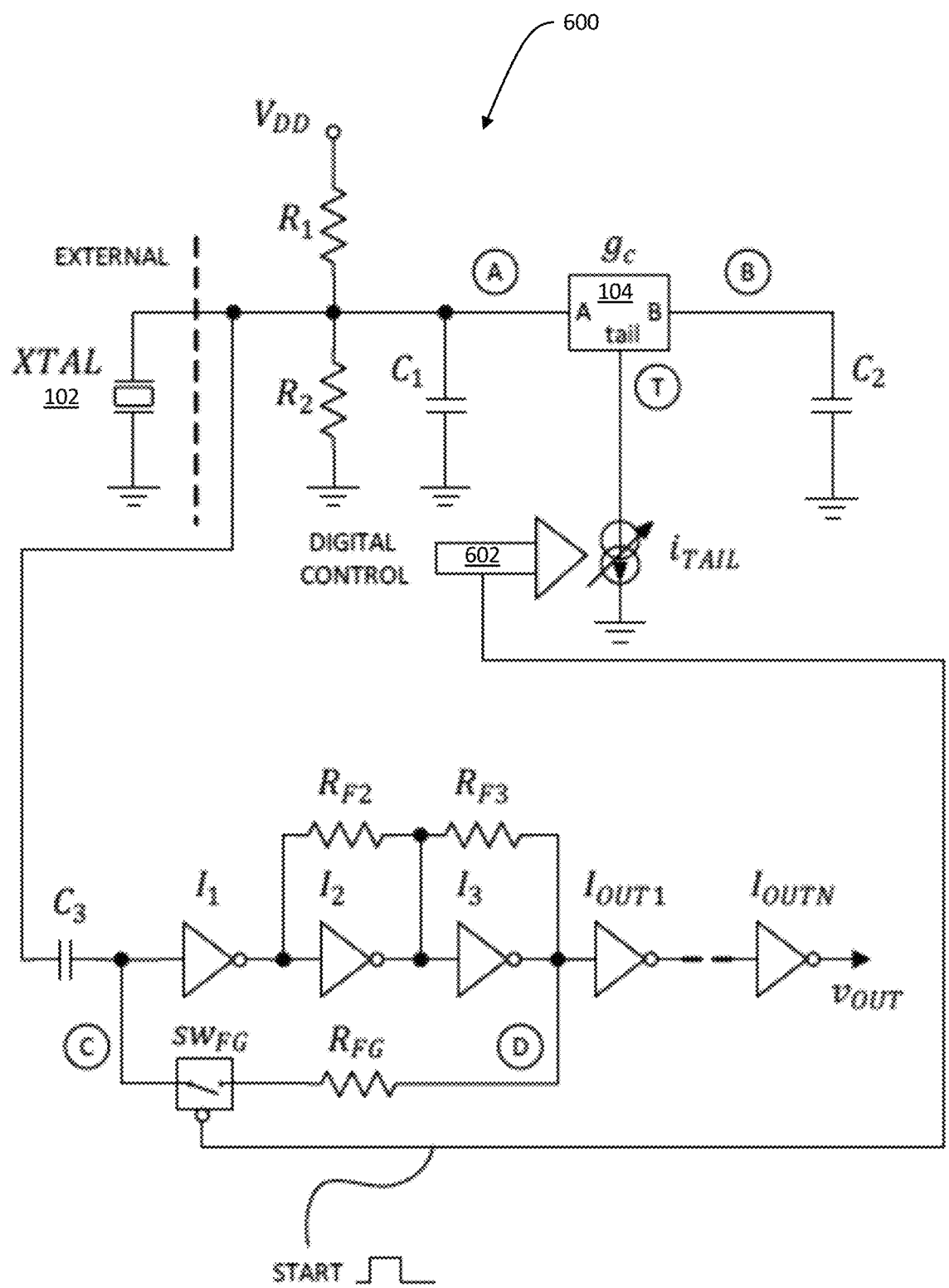
FIG. 6 is a schematic of an oscillator circuit that provides an output buffer in accordance with an embodiment of the present disclosure.

Referring now to FIG. 6, there is depicted an oscillator circuit 600 that provides an output buffer in accordance with an embodiment of the present disclosure. The circuit 600 includes common elements likewise identified from FIGS. 1-5, and further includes a digital control for providing the loop-gain of the oscillator via a digital START signal 602 for temporarily increasing/boosting the loop-gain to accelerate start-up of the oscillator as described in copending U.S. patent application Ser. No. 15/695,493 filed on Sep. 5, 2017, assigned to the Assignee of the present application and incorporated by reference herein. In accordance with an embodiment, the digital control (with the START signal 602) may alter a digitally-controlled tail current $i_{TAIL}$ of the transconductor 104, where $i_{TAIL}$ may be provided in accordance with the schematic depicted in FIG. 7, which is described further below and in copending U.S. patent application Ser. No. 15/695,493, above. In addition to boosting the loop-gain, a high START signal 602 disables the global feedback around inverters $I_1$, $I_2$, and $I_3$ by opening a switch $SW_{FG}$ to disconnect resistor $R_{FG}$ from the oscillator circuit. Consequently, the output buffer presents a high input impedance to node A of the oscillator circuit during start-up (START=high), such that no self-oscillation is present in the circuit, and the signal builds up in the oscillator at the correct frequency as a result of the increased loop gain. At the end of the start pulse, START=low, the global feedback is thereafter enabled in the output buffer by closing switch $SW_{FG}$ and the signal on node A has a sufficiently high amplitude such that no self-oscillation is present in the buffer, and the duty cycle of the output signal naturally converges to 50% as a result of the global feedback provided by $R_{FG}$. Furthermore, as a result of the appreciable voltage gain and fast signal transitions in the amplifying chain composed of $I_1$, $I_2$, and $I_3$, the phase noise of the output signal is also low.

Figure 7:
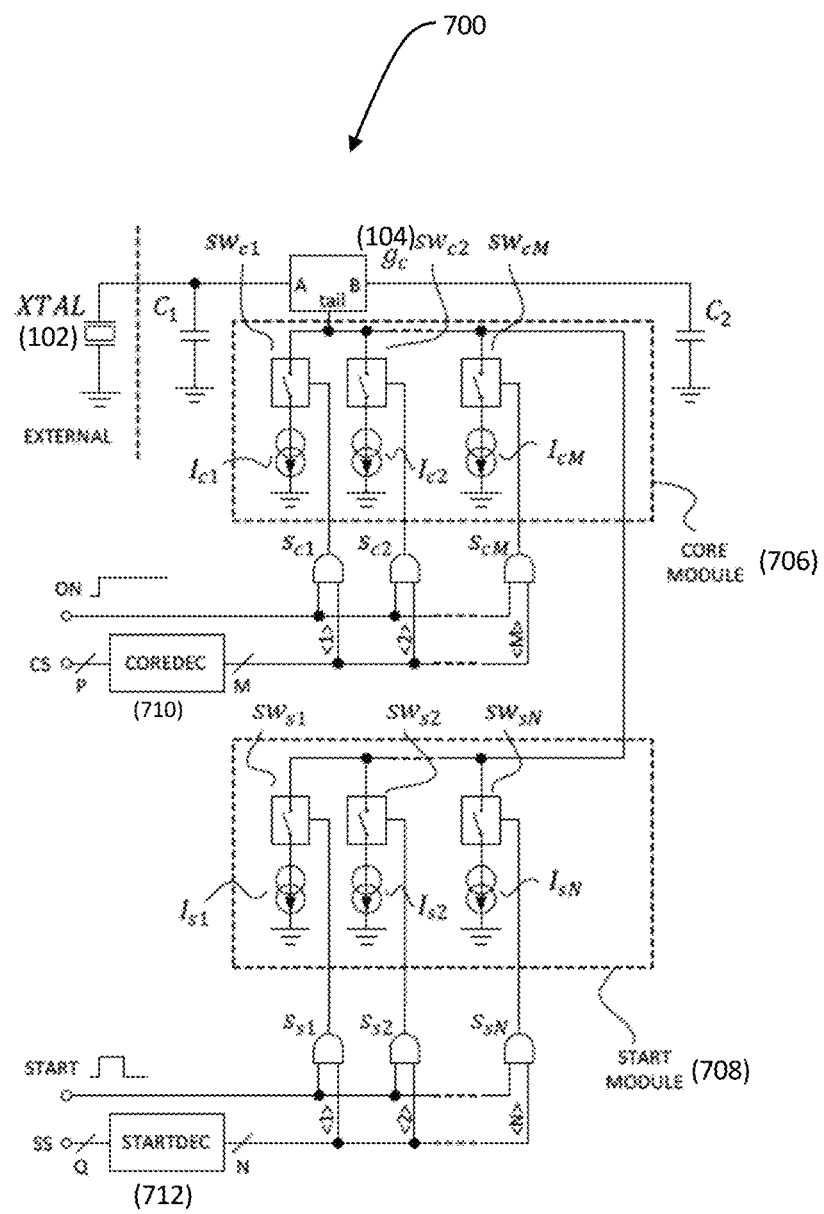
FIG. 7 is a schematic of a circuit in accordance with an embodiment of the disclosure for digitally controlling the bias of the oscillator.

Referring now to FIG. 7, there is depicted a schematic circuit diagram 700 in accordance with an embodiment of the disclosure for digitally controlling the tail current $i_{TAIL}$ of the oscillator 102 of FIGS. 1-6. In the sample embodiment, the currents of sources $I_{c1}$, . . . , $I_{cM}$ and $I_{s1}$, . . . , $I_{sN}$ may be selectively added via switches $sw_{c1}$, . . . , $sw_{cM}$, and $sw_{s1}$, . . . , $sw_{sN}$, respectively. Currents $I_{c1}$, . . . , $I_{cM}$ and switches $sw_{c1}$, . . . $sw_{cM}$ may be grouped into a core module 706 coupled to transconductance cell $g_c$ 104 to provide a programmable steady-state value $I_0$. Similarly, currents $I_{s1}$, . . . , $I_{sN}$ and switches $sw_{s1}$, . . . , $sw_{sN}$ may be grouped into a start module 708 that, along with the core module 706, provides a programmable start value $I_{START}$. The steady-state current Jo is programmed by a P-bit core select code CS applied to a core-select decoder COREDEC 710, which in turn provides desired logic levels to its M output lines coupled to respective logic AND gates $S_{c1}$, . . . , $S_{cM}$. Similarly, current provided by the start module is programmed by a Q-bit core select code SS applied to a start-select decoder STARTDEC 712, which in turn provides desired logic levels to its N output lines coupled to respective logic AND gates $S_{s1}$, . . . , $S_{sN}$.

Figure 8:
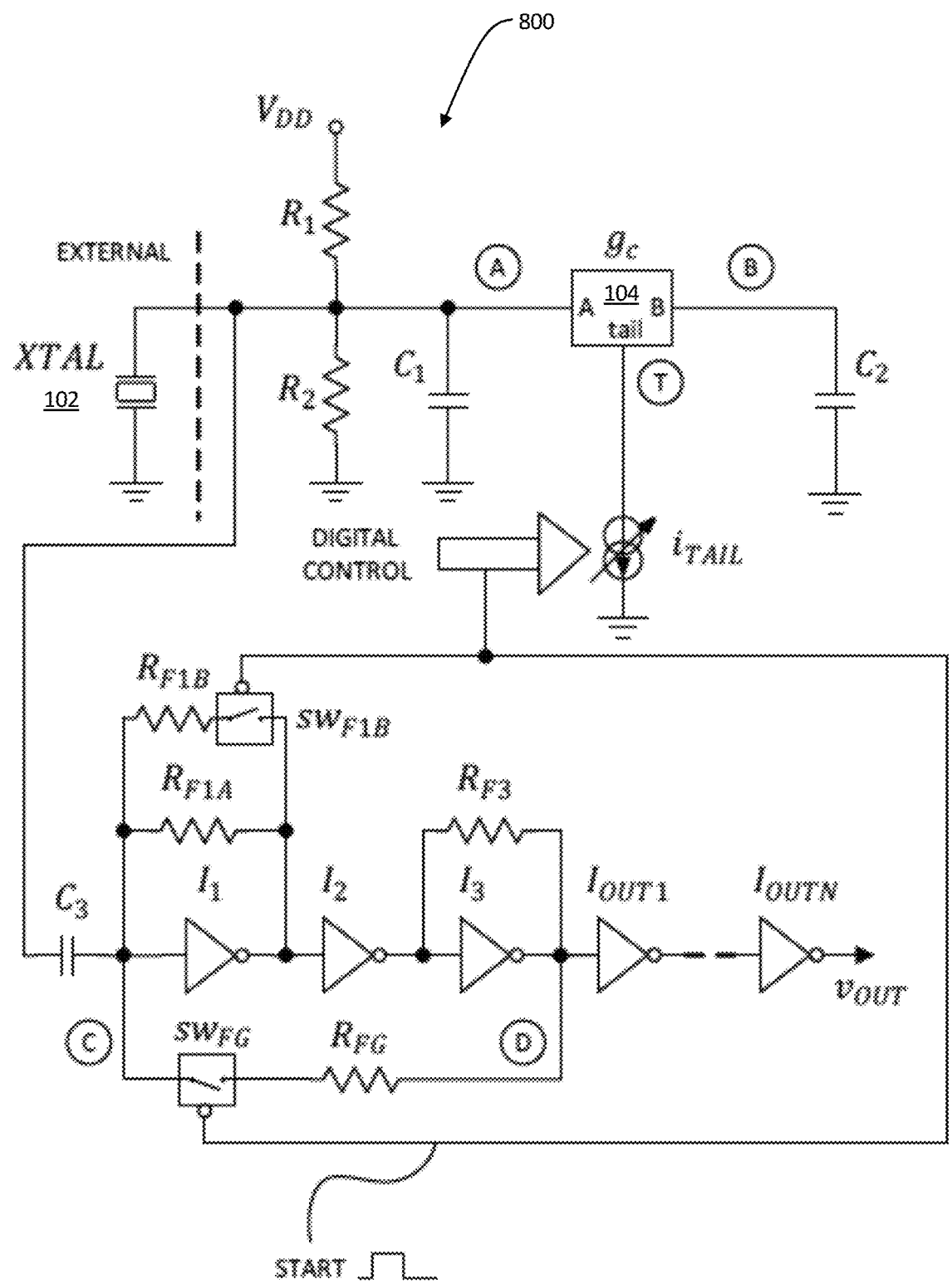
FIG. 8 is a schematic of an oscillator circuit having an output buffer that includes elements for controlling the local feedback in the amplifying chain to ameliorate unwanted transients.

Referring now to FIG. 8, there is depicted a circuits 800 in accordance with an embodiment of the disclosure that includes elements for controlling the local feedback in the amplifying chain to ameliorate unwanted transients when START reverts to low (i.e., START=low). The circuit 800 of FIG. 8 includes common elements of FIGS. 1-6 and adds additional components such that START=high is operable to disable/reduce the local feedback around $I_1$ via switch $SW_{F1B}$ coupled to resistor $R_{F1B}$. Weak local feedback is maintained around $I_1$ when START=high by a relatively large $R_{F1A}$ such that the voltage on node C is maintained around $V_{DD}/2$ at all times, and no unwarranted transients are produced when START goes low (i.e., START=low). $R_{F3}$ provides a constant local feedback around inverter $I_3$. The global feedback loop exists between nodes C and D. The amplifying chain composed of the cascade of inverters $I_{OUT1}$ . . . $I_{OUTN}$ is analogous to that shown in FIG. 1.

Figure 9:
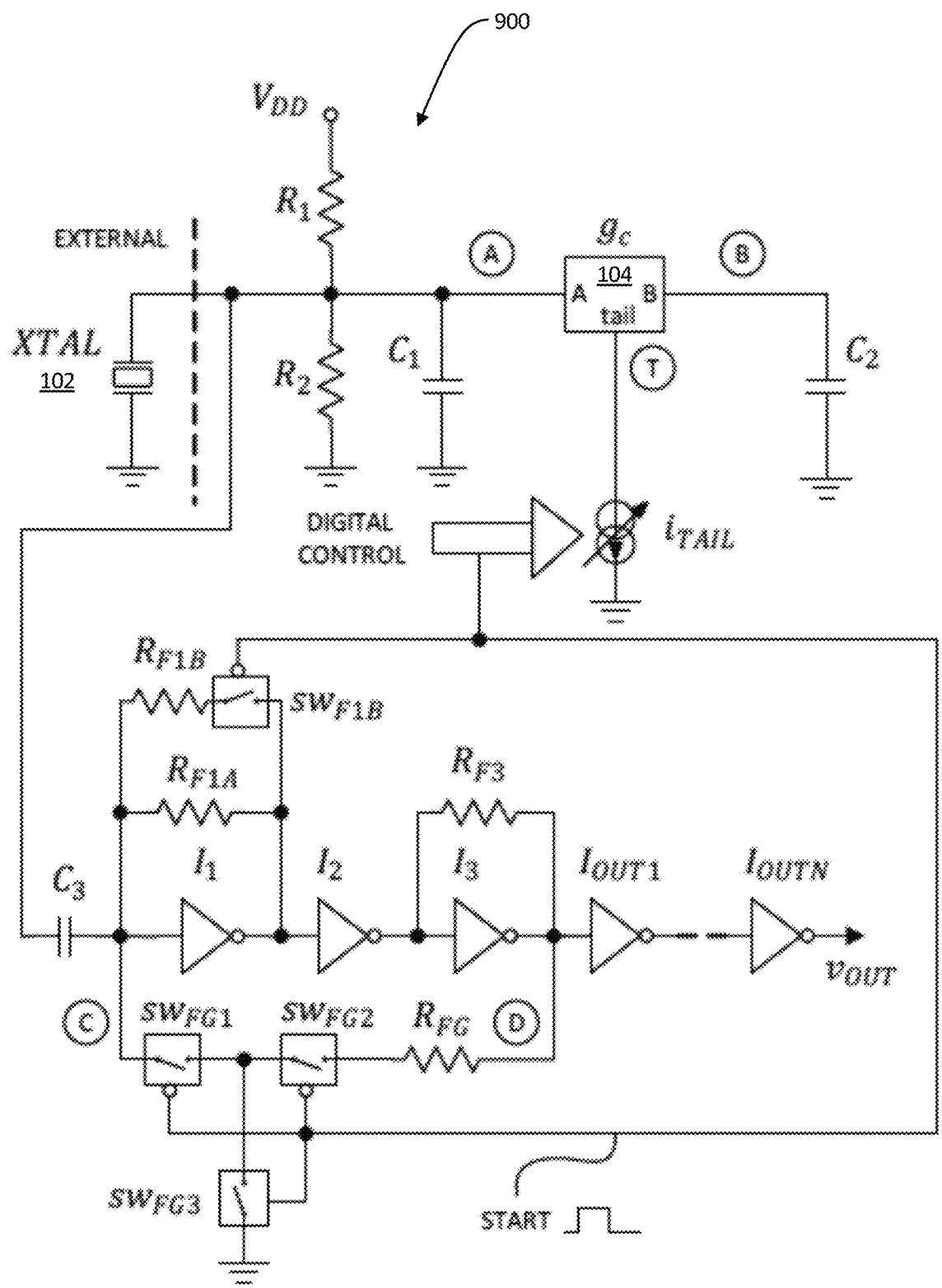
FIG. 9 is a schematic of an oscillator circuit having an output buffer in accordance with another embodiment of the disclosure.
Figure 10:
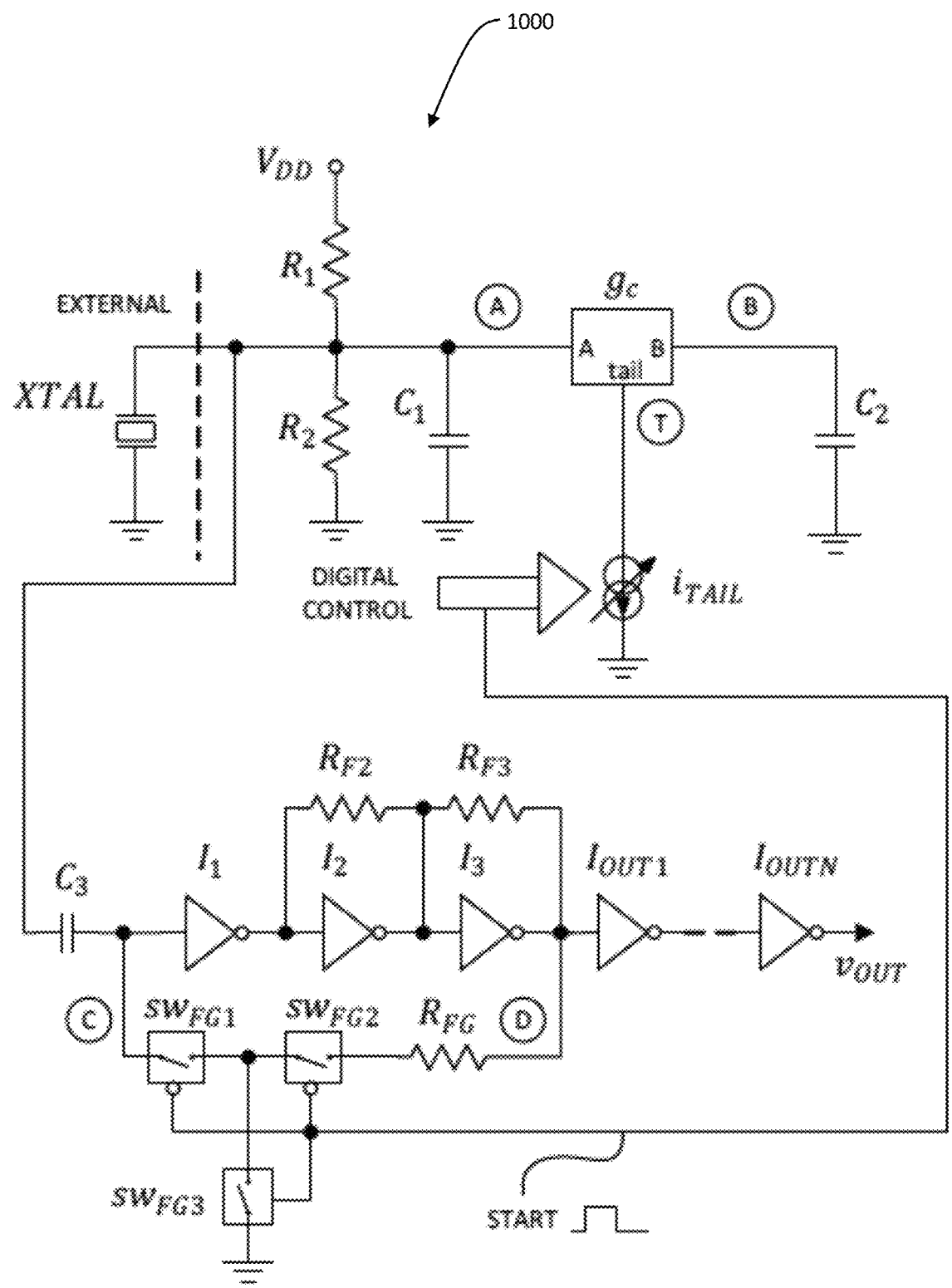
FIG. 10 is a schematic of a modified circuit to the circuit shown in FIG. 6.

With reference now to FIG. 9, there is depicted a circuit 900 having a modification of the circuit 800 in FIG. 8, where the switch $SW_{FG}$ is replaced by a T network composed of a plurality of switches $SW_{FG1}$, $SW_{FG2}$, and $SW_{FG3}$ responsive to a digital control signal, which provide better isolation while in the OFF state, and a lower likelihood of buffer self-oscillation. Again, like elements from the prior figures have the same reference numerals and component identifiers. This same arrangement may be employed in the circuit 600 of FIG. 6, as depicted by a modified circuit thereof 1000 as shown in FIG. 10.

Figure 11:
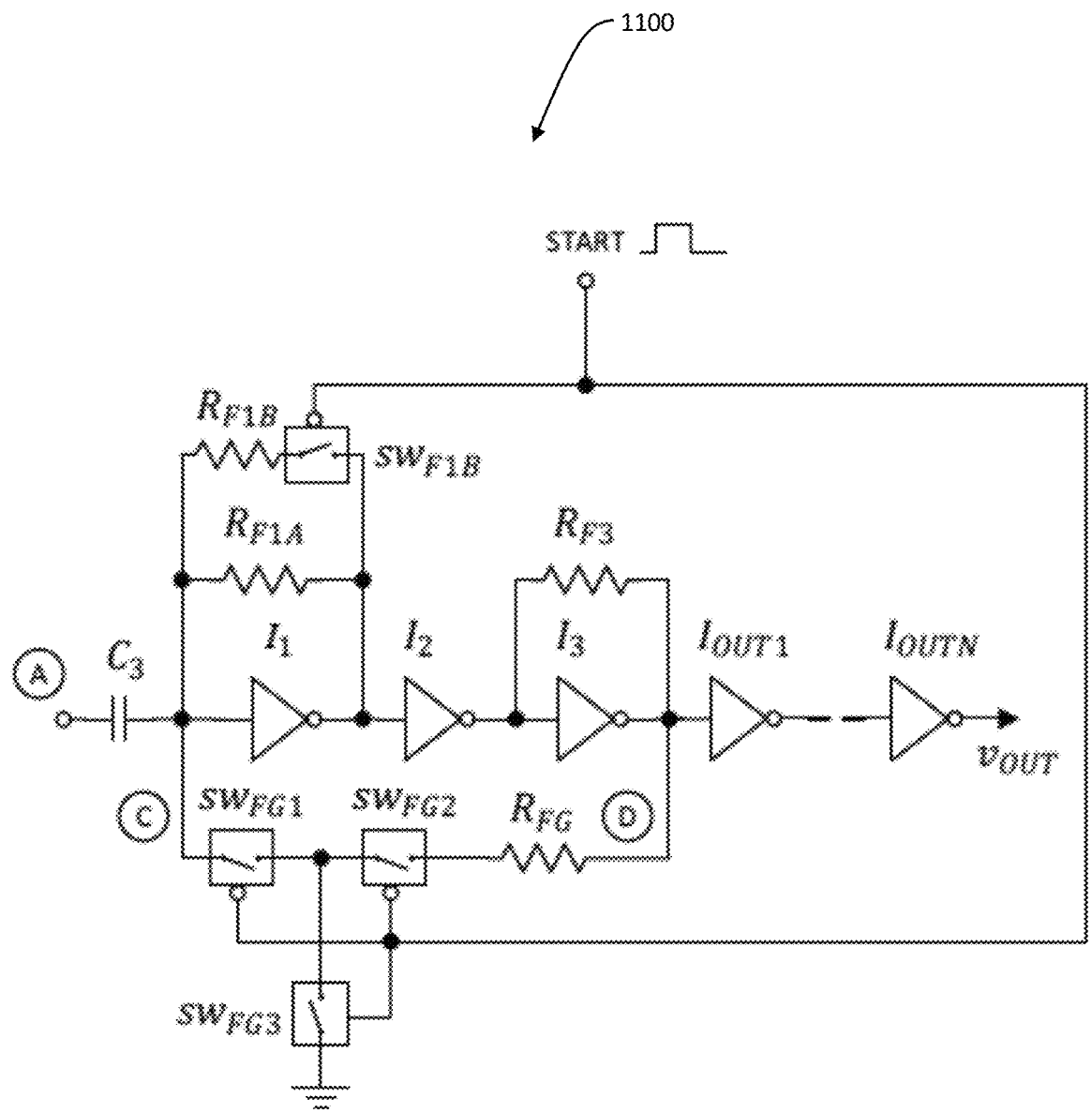
FIG. 11 is a schematic of an output buffer which forms part of the circuit of FIG. 10.

FIG. 11 is a schematic of an output buffer 1100 which forms part of the circuit 900 of FIG. 9. The components are identical to those in circuit 900. A digital control (START) signal opens switch $SW_{F1B}$ to disable the local feedback around $I_1$ (referred to herein as a "second negative feedback loop") and thus adjust the local feedback of the circuit 900 where a first feedback level of the circuit 900 is present in the circuit until one or more of a defined level of oscillation and a defined period of time is reached during start-up of the oscillator circuit, a second feedback level is thereafter present in the oscillator circuit, and the first feedback level is less than the second feedback level. The defined period of time is a time window defined by a first time when the first feedback level is present in the oscillator circuit, and a second time later than the first time when the second feedback level is present in the circuit. These time values may be characterized by a first time when the START signal goes high, which initiates oscillator start-up, and second time when the START signal goes low, which occurs upon a defined level of oscillation being achieved. The defined level of oscillation may be characterized as the level of oscillation sufficient to ensure the desired duty cycle (i.e., 50%).

The START signal opens and closes switches $SW_{FG1}$, $SW_{FG2}$, and $SW_{FG3}$ to disable and thereafter enable the global feedback around $I_1$, $I_2$, and $I_3$. In this manner, at least one negative feedback loop (referred to herein as the "first negative feedback loop") is coupled to a subset of the plurality of corresponding inverters $I_1$, $I_2$, and $I_3$, where the at least one first negative feedback loop of the circuit 900 is disabled in the oscillator circuit in response to the control signal until one or more of a defined level of oscillation and a defined period of time is reached during start-up of the oscillator circuit and where the at least one first negative feedback loop is thereafter enabled in the circuit by closing switches the $SW_{FG1}$, $SW_{FG2}$, and $SW_{FG3}$. The term "subset" of inverters means one or more of the inverters (i.e., one or more of $I_1$, $I_2$, and $I_3$), and the number of inverters shown and described are an example embodiment. Other numbers and combinations of inverters may be employed in accordance with embodiments of the disclosure. In one embodiment, the subset of the plurality of inverters consists of an odd number of inverters. Furthermore, a subset of the plurality of inverters can have selectively enabled and disabled negative feedback loops.

Figure 12:
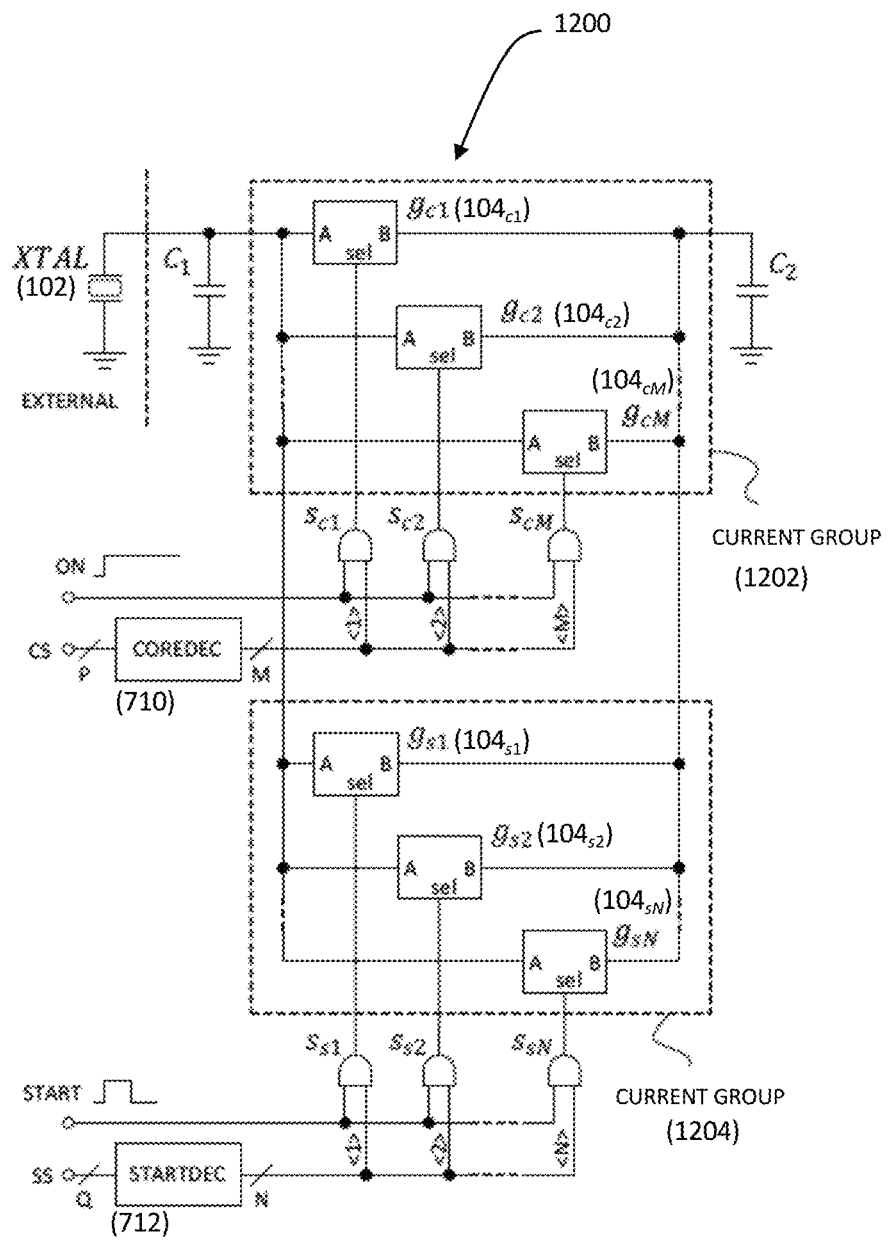
FIG. 12 depicts an implementation of a control signal in a a low-power, one-pin, fast start-up crystal oscillator circuit in accordance with an embodiment of the disclosure.

FIG. 12 depicts an implementation of a control signal in a low-power, one-pin, fast start-up crystal oscillator circuit 1200 having digitally-controlled transconductance modules as shown and described in copending U.S. patent application Ser. No. 15/695,493, see above. The oscillator circuit 1200 generally includes a resonator 102, a plurality of core transconductance cells $g_{c1}, \ldots, g_{cM}$ (104$_{c1}, \ldots,$ 104$_{cM}$) are grouped into a first current group 1202, and a plurality of start-up transconductance cells $g_{s1}, \ldots, g_{sN}$ (104$_{s1}, \ldots,$ 104$_{sN}$) are grouped into a second current group 1204. The start-up transconductance cells $g_{s1}, \ldots, g_{sN}$ (104$_{s1}, \ldots,$ 104$_{sN}$) may be identical to the core transconductance cells $g_{c1}, \ldots, g_{cM}$ (104$_{c1}, \ldots,$ 104$_{cM}$), or they may be scaled versions of core transconductance cells $g_{c1}, \ldots, g_{cM}$ (104$_{c1}, \ldots,$ 104$_{cM}$). Each of the transconductance cells $g_{c1}, \ldots, g_{cM}$ (104$_{c1}, \ldots,$ 104$_{cM}$) and $g_{s1}, \ldots, g_{sN}$ (104$_{s1}, \ldots,$ 104$_{sN}$) are connected in parallel and may be selectively added (i.e., engaged) or deselected (i.e., disengaged) responsive to signals output from logic AND gates $S_{c1}, \ldots, S_{cM}$, and $S_{s1}, \ldots S_{sN}$, respectively. Further, the oscillator 1200 is provided with a core select decoder COREDEC 710 coupled via M output lines to logic AND gates $S_{c1}, \ldots, S_{cM}$, and a start select decoder STARTDEC 712 coupled via M output lines to logic AND gates $S_{s1}, \ldots, S_{sN}$. Each decoder is configured to function with a corresponding number of bits or the plurality of transconductance cells $g_{c1}, \ldots, g_{cM}$ (104$_{c1}, \ldots,$ 104$_{cM}$) and $g_{s1}, \ldots, g_{sN}$ (104$_{s1}, \ldots,$ 104$_{sN}$) can be selected in response to the digital core-select code CS from core select decoder COREDEC 710, and the digital start-select code SS from the start select decoder STARTDEC 712, respectively. In this manner, the outputs of decoders COREDEC 710 and STARTDEC 712 may individually select or deselect each of the transconductance cells $g_{c1}, \ldots, g_{cM}$ (104$_{c1}, \ldots,$ 104$_{cM}$) and $g_{s1}, \ldots, g_{sN}$ (104$_{s1}, \ldots,$ 104$_{sN}$) in current groups 1202, 1204, respectively, via enable signals ON and START, respectively. During the start-up phase of the oscillation, to provide the necessary oscillator loop-gain for a rapid turn-on some of the cells in the core module $g_{c1}, \ldots, g_{cM}$ (104$_{c1}, \ldots,$ 104$_{cM}$) may advantageously be selected concurrently with some of the cells in the start-up module $g_{s1}, \ldots, g_{sN}$ (104$_{s1}, \ldots,$ 104$_{sN}$) when both the ON and START control signals are at a HIGH logic level. After a predetermined time, or when the oscillation is assessed to have a sufficiently large level, the cells in the start module can be disengaged by taking the START control signal to a LOW logic level. The transconductance cells $g_{c1}, \ldots, g_{cM}$ (104$_{c1}, \ldots,$ 104$_{cM}$) and $g_{s1}, \ldots, g_{sN}$ (104$_{s1}, \ldots,$ 104$_{sN}$) are engaged or disengaged via a selection control signal "sel" received at the cell from a corresponding logic AND gate $S_{c1}, \ldots, S_{cM}$, and $S_{s1}, \ldots, S_{sN}$, respectively.

Figure 13:
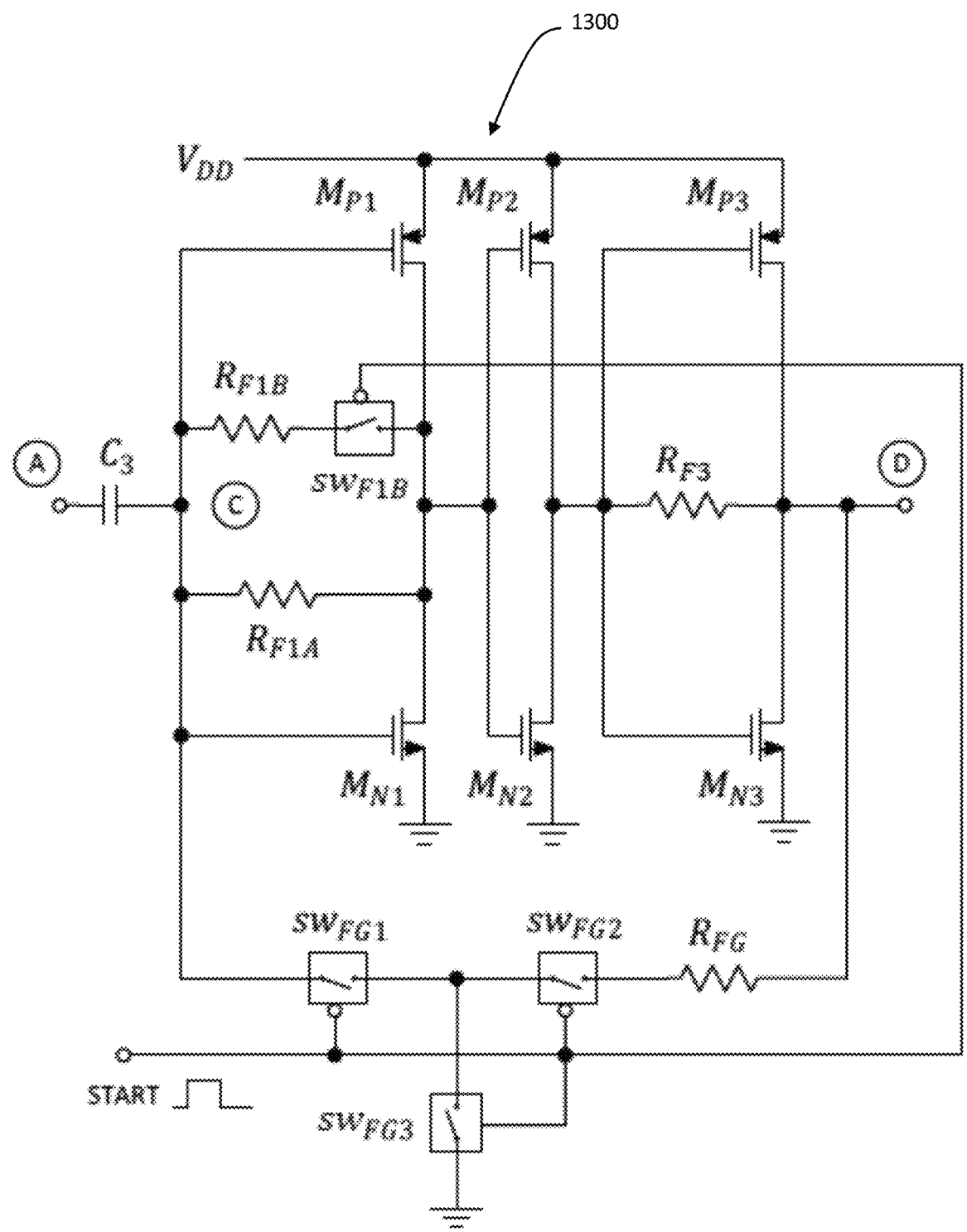
FIG. 13 is a schematic of a complementary metal-oxide semiconductor (CMOS) implementation of the buffer circuit of FIG. 11.

With reference now to FIG. 13, there is depicted a complementary metal-oxide semiconductor (CMOS) implementation of the buffer circuit 1100 of FIG. 11 in accordance with an embodiment of the disclosure. The common elements shown in FIG. 11 are operably coupled to a plurality of transistors $M_{P1}$, $M_{P2}$, $M_{P3}$ to $V_{DD}$ and transistors $M_{N1}$, $M_{N2}$, $M_{N3}$ as shown in the figure.

Figure 14:
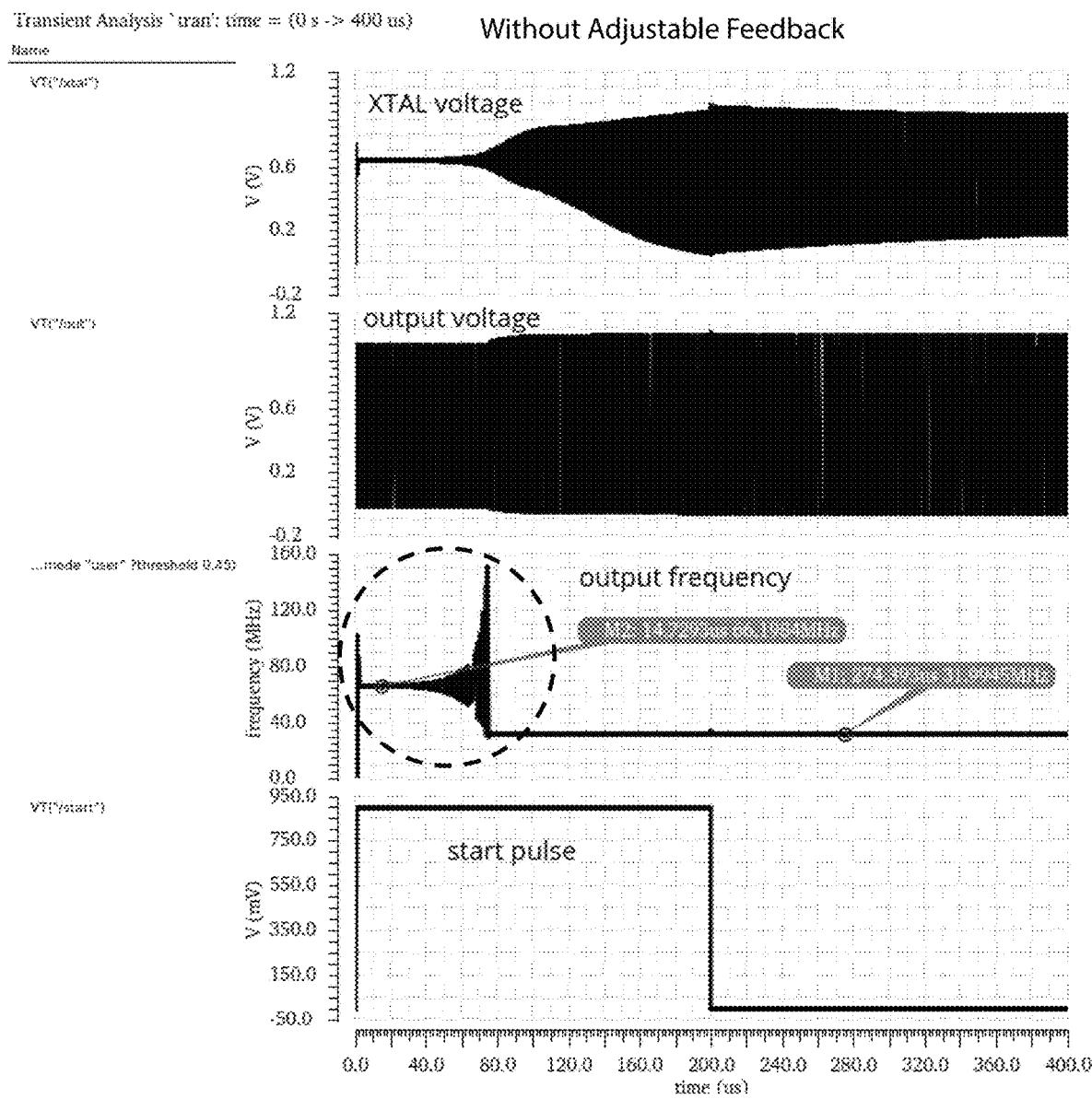
FIG. 14 is a graphical depiction of exemplary crystal and voltage waveforms for an oscillator circuit without adjustable feedback in accordance with embodiments of the disclosure.

FIG. 14 is a graphical depiction of exemplary crystal and voltage waveforms for a circuit without adjustable feedback as shown and described herein.

Figure 15:
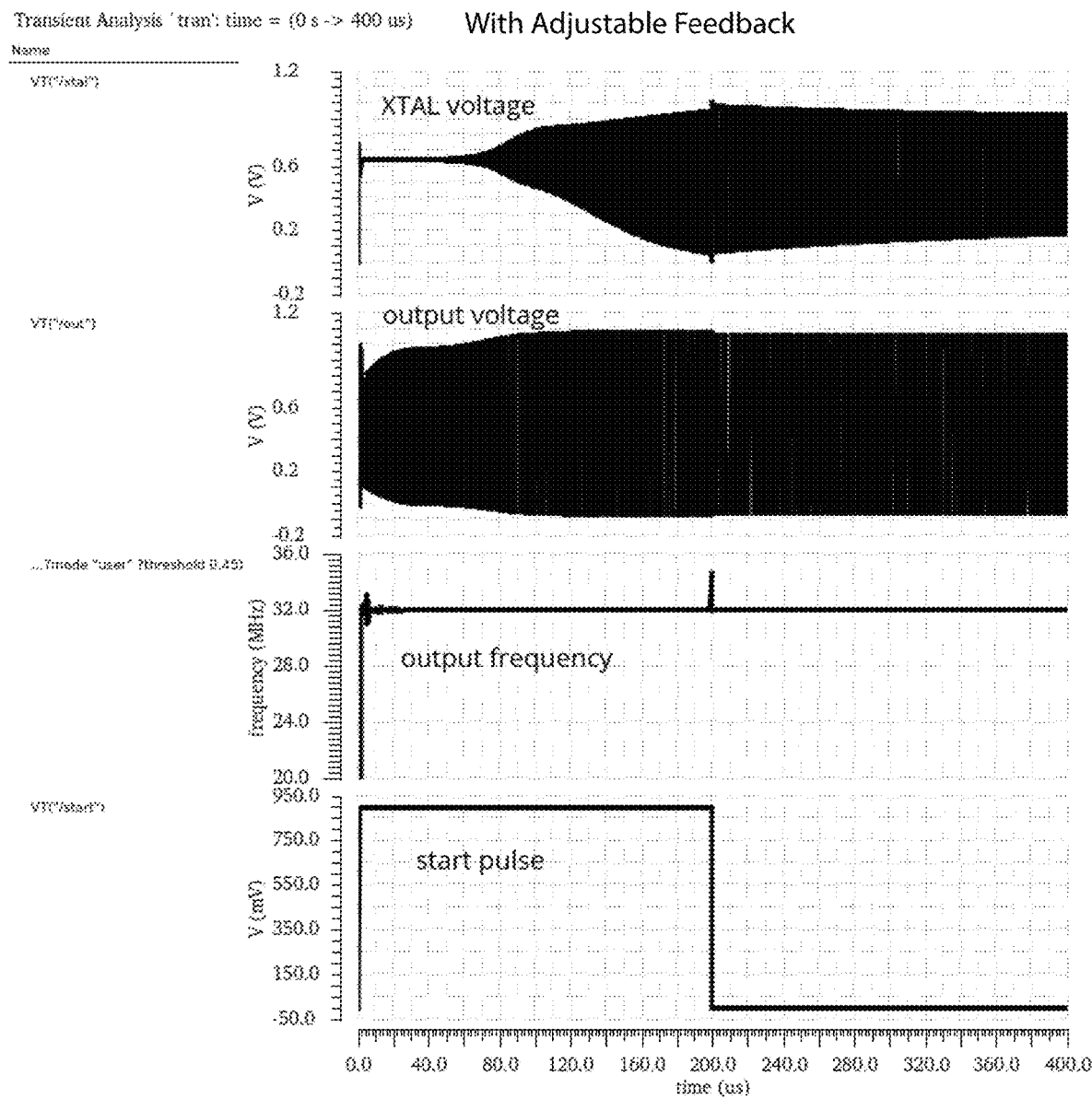
FIG. 15 is a graphical depiction of exemplary crystal and voltage waveforms for oscillator circuits having adjustable feedback and which provide improvements in oscillator performance in accordance with embodiments of the disclosure.

FIG. 15 is a graphical depiction of exemplary crystal and voltage waveforms for the circuits having adjustable feedback as shown in FIGS. 8, 9, 11 and 13 and described above.

The terms "program," "software application," and the like, as used herein, are defined as a sequence of instructions designed for execution on a computer system. A "program," "computer program," or "software application" may include a subroutine, a function, a procedure, an object method, an object implementation, an executable application, an applet, a servlet, a source code, an object code, a shared library/ dynamic load library and/or other sequence of instructions designed for execution on a computer system.

The present disclosure may be embodied within a system, a method, a computer program product or any combination thereof. The computer program product may include a computer readable storage medium or media having computer readable program instructions thereon for causing a processor to carry out aspects of the present invention. The computer readable storage medium can be a tangible device that can retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination of the foregoing.

Reference in the specification to "one embodiment" or "an embodiment" means that a particular feature, structure, or characteristic described in connection with the embodiment is included in at least one embodiment of the system. The appearances of the phrase "in one embodiment" in various places in the specification are not necessarily all referring to the same embodiment.

Embodiments of the present disclosure are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Some portions of the detailed descriptions, like the processes may be presented in terms of algorithms and symbolic representations of operations on data bits within a computer memory. An algorithm may be generally conceived to be steps leading to a desired result. The steps are those requiring physical transformations or manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The operations described herein can be performed by an apparatus. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk, read-only memories (ROMs), random access memories (RAMs), EPROMs, EEPROMs, magnetic or optical cards, or any type of media suitable for storing electronic instructions. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on one computer, partly on the computer, as a stand-alone software package, partly on the first computer and partly on a remote computer or entirely on the remote computer or server. In the latter scenario, the remote computer may be connected to the first computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry to perform embodiments of the present disclosure.

Accordingly, embodiments and features of the present disclosure are set out in the following numbered items:

1. An output buffer for an oscillator circuit, including: at least one inverter; and at least one feedback loop coupled to a corresponding inverter, an amount of feedback provided by the feedback loop being adjustable in response to a control signal, where a first feedback level of the circuit is present in the circuit until one or more of a defined level of oscillation and a defined period of time is reached during start-up of the oscillator circuit, a second feedback level is thereafter present in the oscillator circuit, and the first feedback level is less than the second feedback level.

2. The output buffer for the oscillation circuit of item 1, where the defined period of time is a time window defined by a first time when the first feedback level is present in the oscillator circuit, and a second time later than the first time when the second feedback level is present in the circuit.

3. The output buffer for the oscillator circuit of item 1, where the oscillator circuit includes a single-pin crystal oscillator.

4. The output buffer for the oscillator circuit of item 1, where the oscillator circuit includes a van den Homberg oscillator.

5. An output buffer for an oscillator circuit, including: a plurality of inverters; and at least one negative feedback loop coupled to a subset of the plurality of corresponding inverters, where the at least one negative feedback loop of the circuit is disabled in the oscillator circuit in response to a control signal until one or more of a defined level of oscillation and a defined period of time is reached during start-up of the oscillator circuit, and where the at least one negative feedback loop is thereafter enabled in the circuit.

6. The output buffer for the oscillator circuit of item 5, further including: at least one inverter among the plurality of inverters, where at least one second negative feedback loop is coupled to a corresponding inverter, and an amount of feedback provided by the second negative feedback loop is adjustable in response to a control signal, where a first feedback level of the circuit is present in the oscillator circuit until one or more of a defined level of oscillation and a defined period of time is reached during start-up of the oscillator circuit, and where a second feedback level is thereafter present in the oscillator circuit, where the first feedback level is less than the second feedback level.

7. The output buffer for the oscillator circuit of item 5, where a subset of the plurality of inverters comprises an odd number of inverters.

8. The output buffer for the oscillator circuit of item 7, where a subset of the plurality of inverters have selectively enabled and disabled negative feedback loops.

9. The output buffer for the oscillator circuit of item 5, further including at least one switch responsive to the control signal for adjusting the feedback loop.

10. The output buffer for the oscillator circuit of item 5, further including at least one switch responsive to the control signal for disabling and enabling the at least one negative feedback loop.

11. The output buffer for the oscillator circuit of item 5, where the oscillator circuit includes a single-pin crystal oscillator.

12. The output buffer for the oscillator circuit of item 5, where the oscillator circuit comprises a van den Homberg oscillator.

13. An output buffer for an oscillator circuit, including: a plurality of inverters; at least one negative feedback loop coupled to a subset of the plurality of corresponding inverters, where the at least one negative feedback loop of the circuit is disabled in the oscillator circuit in response to a control signal until one or more of a defined level of oscillation and a defined period of time is reached during start-up of the oscillator circuit and where the at least one negative feedback loop is thereafter enabled in the circuit; and at least one inverter of the plurality of inverters where at least one second negative feedback loop is coupled to the corresponding at least one inverter, an amount of feedback provided by the second negative feedback loop being adjustable in response to a control signal, where a first feedback level of the circuit is present in the oscillator circuit until one or more of a defined level of oscillation and a defined period of time is reached during start-up of the oscillator circuit, a second feedback level is thereafter present in the circuit, and the first feedback level is less than the second feedback level.

14. The output buffer for an oscillator circuit of item 13, where the oscillator circuit includes a single-pin crystal oscillator.

15. The output buffer for the oscillator circuit of item 13, where the oscillator circuit includes a van den Homberg oscillator.

16. A method of buffering an oscillator circuit coupled to an oscillator, the method including: adjusting, in response to a control signal, an amount of feedback provided by at least one feedback loop coupled to a corresponding inverter, where a first feedback level of the circuit is present in the circuit until one or more of a defined level of oscillation and a defined period of time is reached during start-up of the oscillator circuit, a second feedback level is thereafter present in the oscillator circuit, and the first feedback level is less than the second feedback level.

17. The method of buffering the oscillator circuit of item 16, where the defined period of time is a time window defined by a first time when the first feedback level is present in the oscillator circuit, and a second time later than the first time when the second feedback level is present in the oscillator circuit.

18. A method of buffering an oscillator circuit coupled to an oscillator, the method including: disabling, in response to a control signal, at least one negative feedback loop coupled to a subset of a plurality of inverters in the oscillator circuit until one or more of a defined level of oscillation and a defined period of time is reached during start-up of the oscillator circuit, where the at least one negative feedback loop is thereafter enabled in the circuit.

19. The method of buffering the oscillator circuit of item 18, further including: adjusting, in response to a control signal, an amount of feedback provided by at least one negative feedback loop coupled to a corresponding inverter among at least one inverter, where a first feedback level of the circuit is present in the circuit until one or more of a defined level of oscillation and a defined period of time is reached during start-up of the oscillator circuit, and where a second feedback level is thereafter present in the oscillator circuit, where the first feedback level is less than the second feedback level.

20. The method of buffering the oscillator circuit of item 19, where a subset of the at least one inverter includes an odd number of inverters.

21. A method of buffering an oscillator circuit coupled to an oscillator, the method including: disabling, in response to a control signal, at least one negative feedback loop coupled to a subset of a plurality of inverters in the oscillator circuit until one or more of a defined level of oscillation and a defined period of time is reached during start-up of the oscillator circuit, and where the at least one negative feedback loop is thereafter enabled in the circuit; and adjusting, in response to a control signal, an amount of feedback provided by at least second negative feedback loop coupled to a corresponding inverter of at least one inverter, where a first feedback level of the circuit is present in the circuit until one or more of a defined level of oscillation and a defined period of time is reached during start-up of the oscillator circuit, a second feedback level is thereafter present in the oscillator circuit, and the first feedback level is less than the second feedback level.

In accordance with the foregoing, a novel output buffer and method for crystal oscillators that prevents self-oscillation in the output buffer during or after start-up, ensures low output phase noise, and provides a duty cycle of the digital output signal appropriate for driving other digital circuits in the system, is disclosed.

Having thus described the invention of the present application in detail and by reference to embodiments thereof, it will be apparent that modifications and variations are possible without departing from the scope of the invention defined in the appended claims as follows:

1. An output buffer for an oscillator circuit, comprising:
   at least one inverter of the output buffer; and
   at least one feedback loop of the output buffer coupled to a corresponding inverter of the output buffer, an amount of feedback provided by the at least one feedback loop being adjustable in response to a control signal, where a first feedback level of the at least one feedback loop is present until one or more of a defined level of oscillation and a defined period of time is reached during start-up of the oscillator circuit, a second feedback level of the at least one feedback loop is thereafter present, and the first feedback level is less than the second feedback level.

2. The output buffer for the oscillation circuit of claim 1, where the defined period of time is a time window defined by a first time when the first feedback level of the at least one feedback loop is present, and a second time later than the first time when the second feedback level of the at least one feedback loop is present.

3. The output buffer for the oscillator circuit of claim 1, where the oscillator circuit comprises a single-pin crystal oscillator.

4. The output buffer for the oscillator circuit of claim 1, where the oscillator circuit comprises a van den Homberg oscillator.

5. An output buffer for an oscillator circuit, comprising:
a plurality of inverters of the output buffer; and
at least one negative feedback loop of the output buffer coupled to a subset of the plurality of corresponding inverters of the output buffer, where the at least one negative feedback loop of the output buffer is disabled in response to a control signal until one or more of a defined level of oscillation and a defined period of time is reached during start-up of the oscillator circuit, and where the at least one negative feedback loop of the output buffer is thereafter enabled.

6. The output buffer for the oscillator circuit of claim 5, further comprising:
at least one inverter among the plurality of inverters, where at least one second negative feedback loop of the output buffer is coupled to a corresponding inverter, and an amount of feedback provided by the at least one second negative feedback loop is adjustable in response to a control signal, where a first feedback level of the at least one second negative feedback loop is present until one or more of a defined level of oscillation and a defined period of time is reached during start-up of the oscillator circuit, and where a second feedback level of the at least one second negative feedback loop is thereafter present, where the first feedback level is less than the second feedback level.

7. The output buffer for the oscillator circuit of claim 5, where a subset of the plurality of inverters comprises an odd number of inverters.

8. The output buffer for the oscillator circuit of claim 7, where a subset of the plurality of inverters have selectively enabled and disabled negative feedback loops.

9. The output buffer for the oscillator circuit of claim 5, further comprising at least one switch responsive to the control signal for adjusting the feedback loop.

10. The output buffer for the oscillator circuit of claim 5, further comprising at least one switch responsive to the control signal for disabling and enabling the at least one negative feedback loop.

11. The output buffer for the oscillator circuit of claim 5, where the oscillator circuit comprises a single-pin crystal oscillator.

12. The output buffer for the oscillator circuit of claim 5, further comprising:
at least one inverter of the plurality of inverters where at least one second negative feedback loop of the output buffer is coupled to the corresponding at least one inverter, an amount of feedback provided by the at least one second negative feedback loop being adjustable in response to a control signal, where a first feedback level of the at least one second negative feedback loop is present until one or more of a defined level of oscillation and a defined period of time is reached during start-up of the oscillator circuit, a second feedback level of the at least one second negative feedback loop is thereafter present, and the first feedback level is less than the second feedback level.

13. The output buffer for an oscillator circuit of claim 12, where the oscillator circuit comprises a single-pin crystal oscillator.

14. The output buffer for the oscillator circuit of claim 12, where the oscillator circuit comprises a van den Homberg oscillator.

15. A method of buffering an oscillator, the method comprising:
adjusting, in response to a control signal, an amount of feedback provided by at least one feedback loop coupled to a corresponding inverter of an output buffer for the oscillator, where a first feedback level of the at least one feedback loop is present until one or more of a defined level of oscillation and a defined period of time is reached during start-up of the oscillator, a second feedback level of the at least one feedback loop is thereafter present, and the first feedback level is less than the second feedback level.

16. The method of buffering the oscillator of claim 15, where the defined period of time is a time window defined by a first time when the first feedback level is present, and a second time later than the first time when the second feedback level is present.

17. A method of buffering an oscillator, the method comprising:
disabling, in response to a control signal, at least one negative feedback loop coupled to a subset of a plurality of inverters of an output buffer for the oscillator until one or more of a defined level of oscillation and a defined period of time is reached during start-up of the oscillator, where the at least one negative feedback loop is thereafter enabled.

18. The method of buffering the oscillator of claim 17, further comprising:
adjusting, in response to a control signal, an amount of feedback provided by at least one negative feedback loop coupled to a corresponding inverter among at least one inverter, where a first feedback level of the at least one negative feedback loop is present until one or more of a defined level of oscillation and a defined period of time is reached during start-up of the oscillator circuit, and where a second feedback level of the at least one negative feedback loop is thereafter present, where the first feedback level is less than the second feedback level.

19. The method of buffering the oscillator of claim 18, where a subset of the at least one inverter comprises an odd number of inverters.

* * * * *